US009399287B2

(12) United States Patent
Qu et al.

(10) Patent No.: US 9,399,287 B2
(45) Date of Patent: Jul. 26, 2016

(54) SPATIAL-LINK-TYPE MANIPULATOR

(75) Inventors: Daokui Qu, Liaoning (CN); Yucong Zhu, Liaoning (CN); Fengli Wang, Liaoning (CN); Weijin Zhu, Liaoning (CN); Yitian Sun, Liaoning (CN); Jishun Dong, Liaoning (CN); Junshan Bao, Liaoning (CN); Xinrong Shang, Liaoning (CN)

(73) Assignee: SHENYANG SIASUN ROBOT & AUTOMATION CO., LTD., Liaoning (CN)

( * ) Notice: Subject to any disclaimer, the term of this patent is extended or adjusted under 35 U.S.C. 154(b) by 145 days.

(21) Appl. No.: 14/356,770

(22) PCT Filed: Jul. 19, 2012

(86) PCT No.: PCT/CN2012/078846
§ 371 (c)(1),
(2), (4) Date: Jul. 2, 2014

(87) PCT Pub. No.: WO2013/102348
PCT Pub. Date: Jul. 11, 2013

(65) Prior Publication Data
US 2014/0311270 A1 Oct. 23, 2014

(30) Foreign Application Priority Data
Jan. 6, 2012 (CN) .......................... 2012 1 0003741

(51) Int. Cl.
*B25J 9/10* (2006.01)
*H01L 21/677* (2006.01)

(52) U.S. Cl.
CPC ........... *B25J 9/107* (2013.01); *H01L 21/67742* (2013.01); *Y10T 74/20305* (2015.01)

(58) Field of Classification Search
CPC ... H01L 21/677; H01L 21/67742; B25J 9/107
USPC ....................................................... 74/490.01
See application file for complete search history.

(56) References Cited

U.S. PATENT DOCUMENTS 5,421,695 A * 6/1995 Kimura .................... B25J 9/107
414/744.5
7,040,852 B2 5/2006 Mori et al.
(Continued)

FOREIGN PATENT DOCUMENTS

CN 202388498 8/2012
JP 9-155775 6/1997
(Continued)

OTHER PUBLICATIONS

International Search Report dated Nov. 1, 2012 regarding International Application No. PCT/CN2012/078846.

*Primary Examiner* — Ernesto Suarez
*Assistant Examiner* — Ronald Jarrett
(74) *Attorney, Agent, or Firm* — B. Aaron Schulman, Esq.; Stites & Harbison, PLLC

(57) ABSTRACT

A spatial-link-type manipulator, comprising a drive device (10), links and rotating shafts connected between the links; the drive device comprises a connecting shaft (13); the connecting shaft comprises an outer wall (131) and an inner wall (133); each link comprises a large boom (20), a small boom (30), an oblique large boom (60), an oblique small boom (50) and a terminal component (40); the large boom and the oblique large boom are respectively a straight link; the small boom and the oblique small boom are respectively a bent link; the large boom, the small boom and one end of the terminal component form a primary motion chain; the oblique large boom, the oblique small boom and the other end of the terminal component form a secondary motion chain; the drive device drives the large boom to move around a rotating shaft A so as to drive the primary motion chain, and drives the secondary motion chain via the terminal component so as to realize rectilinear motion of the terminal component. The present invention has a simple structure and is easy to realize.

8 Claims, 4 Drawing Sheets

(56) References Cited

U.S. PATENT DOCUMENTS

2003/0202872 A1 10/2003 Mori et al.
2008/0019816 A1* 1/2008 Sato ................. B25J 9/107
　　　　　　　　　　　　　　　　　　414/744.4

FOREIGN PATENT DOCUMENTS

| JP | 11-207666 | 8/1999 |
| JP | 11-216691 | 8/1999 |
| JP | 3719354 | 11/2005 |

* cited by examiner

SPATIAL-LINK-TYPE MANIPULATOR

TECHNICAL FIELD

The invention relates to a manipulator, in particular to a spatial-link-type manipulator for the production of electronic industry.

BACKGROUND

Generally, manipulators are widely applied to electronic product in industries areas such as automobiles, plastics, drugs, foods, etc., for carrying, retrieving, assembling, spraying, welding and other operations instead of manual operations to enhance production efficiency.

Most of linkage type manipulators employ a dual drive. Two manipulators cooperatively work on the same plane, so the travel trajectories of the two manipulators are completely coupled and restricted by a steel band. However, the two manipulators have their own power drivers, and restricted by one steel band during motion, so the consistency of the motion and the travel trajectory precision of the entire manipulator is affected.

SUMMARY OF THE INVENTION

To solve the above problems, it is necessary to develop a single-degree-of-freedom, linear-translation, spatial linkage type structure which construct a manipulator structure to conduct strictly single-degree-of-freedom, linear translational motion.

A spatial-link-type manipulator is provided, comprising a drive device, links and a rotating shaft for connecting the links. The drive device comprises a connecting shaft. The connecting shaft comprises an outer wall and an inner wall. Each link comprises a large boom, a small boom, an oblique large boom, an oblique small boom and a terminal component. The large boom and the oblique large boom are respectively a straight link, while the small boom and the oblique small boom are respectively a bent link. One end of the large boom is connected with the outer wall through a rotating shaft A, while the other end is connected with the small boom through a rotating shaft B. The two ends of the terminal component are respectively connected with the small boom and the oblique small boom through a rotating shaft C and a rotating shaft D. One end of the oblique large boom is connected with the oblique small boom through a rotating shaft E, while the other end is connected with the inner wall through a rotating shaft F. The large boom the small boom and one end of the terminal component form a primary motion chain ABC, while the oblique large boom, the oblique small boom and the other end of the terminal component form a secondary motion chain DEF. The drive device generate the power to the large boom for moving around the rotating shaft A to drive the primary motion chain ABC, and drives the secondary motion chain DEF via the terminal component so as to realize rectilinear motion of the terminal component.

In one embodiment, the rotating shaft A that connects the large boom and the outer wall is not axially parallel to the rotating shaft F that connects the oblique large boom and the oblique connecting member.

In one embodiment, the terminal component is a horizontal link parallel to the plane where the drive device exists.

In one embodiment, the small alarm and the oblique small boom are asymmetric to the middle point of the terminal component.

In one embodiment, the radian of the small boom is equal to that of the oblique small boom.

In one embodiment, the axes of the rotating shafts A, B, C are vertical to the plane of the terminal component.

In one embodiment, the axes of the rotating shafts D, E, F are mutually parallel and not vertical to the plane of the terminal component.

In one embodiment, the rotating shaft A is coaxial with the drive device.

In one embodiment, the spatial-link-type manipulator also comprises a clamp for clamping a product.

In one embodiment, the spatial-link-type manipulator also comprises an oblique connecting member that is installed on the inner wall. The large inclined wall is fixed on the oblique connecting member.

Compared with the prior art, the spatial-link-type manipulator features in that: the large boom, the small boom and one end of the terminal component form a primary motion chain ABC, while the oblique large boom, the oblique small boom and the other end of the terminal component form a secondary motion chain DEF; the small boom and the terminal component; the drive device drives the large boom to move around the rotating shaft A for driving the primary motion chain ABC, and drives the secondary motion chain DEF via the terminal component for realizing the rectilinear motion of the terminal component. The two manipulators are not required to cooperatively work on the same plate, so the invention brings great convenience.

| Description of the signs of the major components | |
|---|---|
| Drive device | 10 |
| Base | 11 |
| Connecting shaft | 13 |
| Outer wall | 131 |
| Inner wall | 133 |
| Large boom | 20 |
| Small boom | 30 |
| Terminal component | 40 |
| Clamp | 41 |
| Electronic component | 43 |
| Oblique large boom | 50 |
| Oblique small boom | 60 |
| Oblique connecting member | 70 |

DETAILED DESCRIPTION OF THE INVENTION

Figure 1:
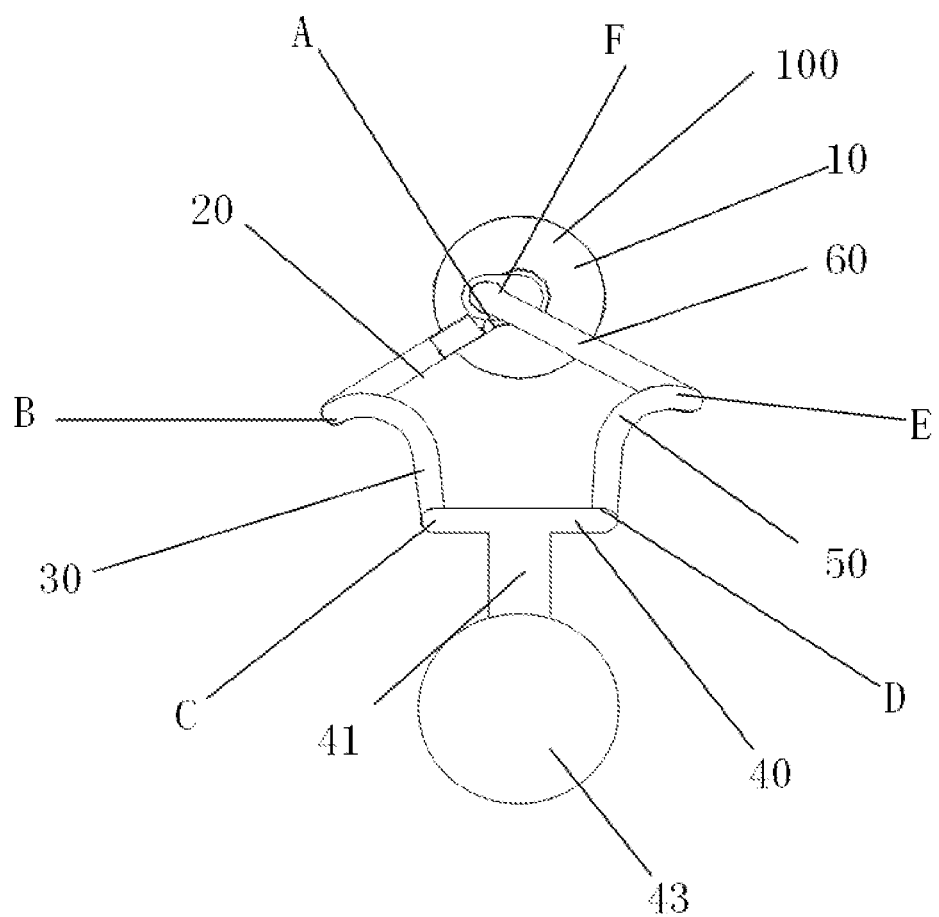
FIG. 1 is a perspective view of a preferable embodiment of the spatial-link-type manipulator of the invention.
Figure 2:
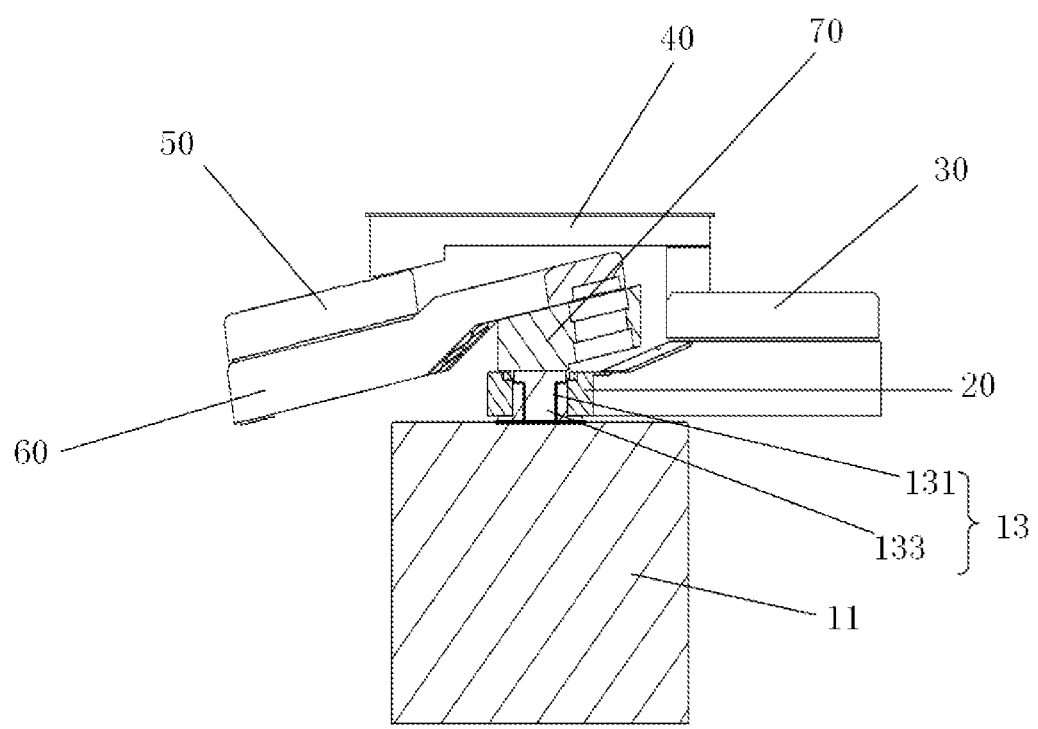
FIG. 2 is a sectional view of the spatial-link-type manipulator of the invention.
Figure 3:
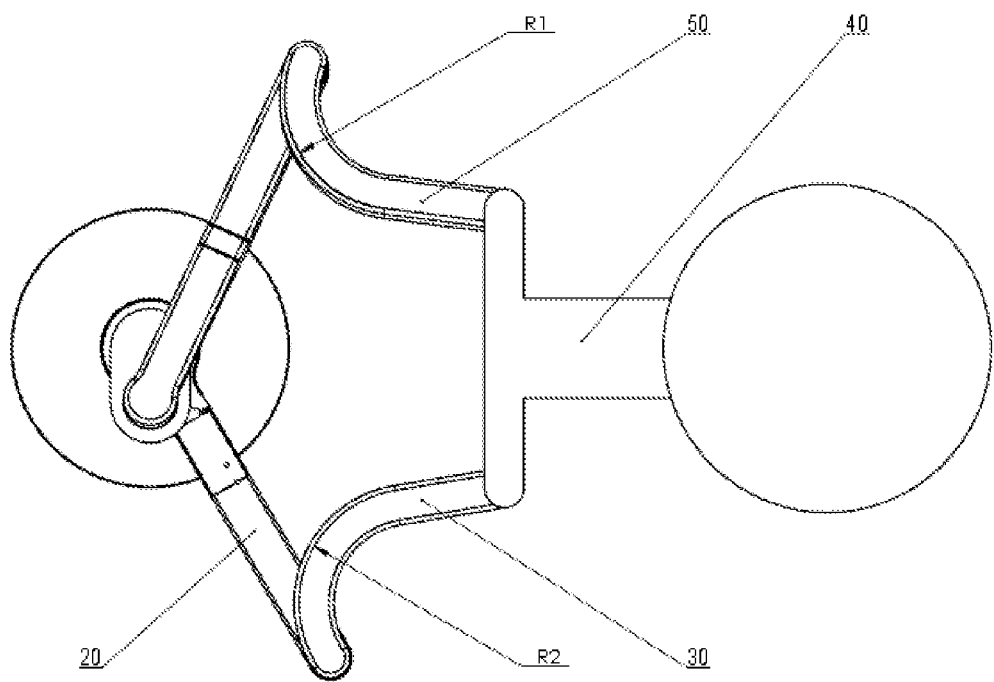
FIG. 3 is a top view of the spatial-link-type manipulator of the invention.
Figure 4:
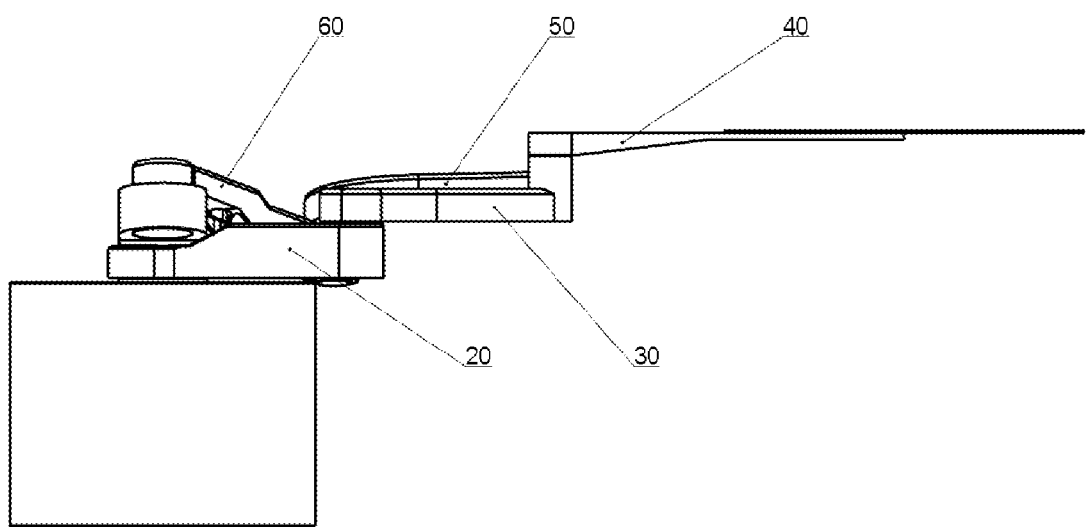
FIG. 4 is a side view of the spatial-link-type manipulator of the invention.

Refer to FIG. 1 and FIG. 2. In one embodiment, a spatial-link-type manipulator comprises a drive device 10 and several links installed on the derive unit 10. Each link comprises a large boom 20, a small boom 30, a terminal component 40, an oblique small boom 50 and an oblique large boom 60. In one embodiment, the large boom 20 and the oblique large boom 60 are respectively a straight link, while the terminal component 40 is a horizontal link; the small boom 30 and the oblique small boom 50 are respectively a bent link; and the small boom 30 and the oblique small boom 50 are in shape of approximate arcs such as circular arcs and equal in radian. The small alarm 30 and the oblique small boom 50 are asymmetric to the middle point of the terminal component 40.

The drive device 10 comprises a base 11 and a connecting shaft 13 installed above the base 11. In one embodiment, the connecting shaft 13 is approximately columnar. The connecting shaft 13 comprises an outer wall 131 and an inner wall 133. The inner wall 133 is equipped with an oblique connecting member 70 that is connected to the oblique large boom 60. In one embodiment, the terminal component 40 is parallel to the plane where the drive device exists.

One end of the large boom 20 is connected to the outer wall 131 of the connecting shaft 13 through a rotating shaft A, and the other end is connected with the first end of the small boom 30 through a rotating shaft B. One end of the oblique large boom 60 is connected with the inclined connecting shaft 70 through a rotating shaft F, and the other end is connected with the first end of the oblique small boom 50 through a rotating shaft E. The two ends of the terminal component 40 are respectively connected with the second end of the small boom 30 and the second end of the oblique small boom 50. In this way, the large boom 20, the small boom 30 and one end of the terminal component 40 form a primary motion chain ABC, while the oblique large boom 60, the oblique small boom 50 and the other end of the terminal component 40 form a secondary motion chain DEF. In one embodiment, the rotating shaft A which connects the large boom 20 and the outer wall 131 is not axially parallel to the rotating shaft F which connects the oblique large boom 60 and the oblique connecting member 70.

Refer to FIG. 1. The connecting line between the rotating shafts A and B is intersected with the connecting line between the rotating shafts E and F, and the inclined angle between the large boom 20 and the oblique large boom 60 is an obtuse angle. The extension line between the rotating shafts B and C is intersected with the extension line between the rotating shafts D and E. In one embodiment, the axes of the rotating shafts A, B, C are vertical to the plane where the terminal component 40 exists. In one embodiment, the axes of the rotating shafts D, E, F are mutually parallel and vertical to the plane where the terminal component 40 exists.

The rotating shaft A is coaxial with the drive device 10.

The terminal component 40 is provided with a clamp 41 in the middle. The clamp 41 is used to clamp an electronic component 43 such as a semiconductor wafer. In use, the drive device 10 drives the large boom 20 to rotate around the rotating shaft A to drive the small boom 30 to rotate around the rotating shaft B and the rotating shaft C as robot working. When the small boom 30 is rotating, the terminal component 40 connected to the small boom 30 pulls the oblique small boom 50 to rotate around the rotating shafts D and E so as to drive the oblique large boom 60 to rotate around the rotating shaft F. In this way, the primary motion chain ABC drives the secondary motion chain DEF to move through the terminal component 40 during motion, and then the terminal component 40 realizes rectilinear motion along a direction parallel to the plane of the drive device 10, thus realizing clamping of the electronic component 43. In this way, the secondary motion chain DEF can be driven to move through operating the primary motion chain ABC, thus realizing a single-degree-of-freedom, linear translation type spatial linkage structure. The terminal component 40 can conduct linear translation in fixed direction on the whole. The invention has a simple structure and is easy to realize.

Those skilled in the art can make corresponding changes or adjustment on actual demands according to the inventive scheme and concept of the invention, but all of those changes and adjustment should belong to the protective scope claimed by the invention.

What is claimed is:

1. A spatial-link-type manipulator, comprises a drive device, links and a rotating shaft for connecting the links,
    said drive device comprising a connecting shaft and an oblique connecting member;
    wherein the connecting shaft comprises an outer wall and an inner wall each link comprises a large boom, a small boom, an oblique large boom, an oblique small boom and a terminal component; the large boom and the oblique large boom are respectively a straight link, while the small boom and the oblique small boom are respectively a bent link; one end of the large boom is connected with the outer wall through a rotating shaft A, while the other end is connected to the small boom through a rotating shaft B; the two ends of the terminal component are respectively connected with the small boom and the oblique small boom through a rotating shaft C and a rotating shaft D; one end of the oblique large boom is connected with the oblique small boom through a rotating shaft E, while the other end is connected with the inner wall through a rotating shaft F; the large boom, the small boom and one end of the terminal component form a primary motion chain ABC, while the oblique large boom, the oblique small boom and the other end of the terminal component form a secondary motion chain DEF; the drive device drives the large boom to move around the rotating shaft A for driving the primary motion chain ABC, and drives the secondary motion chain DEF via the terminal component so as to realize rectilinear motion of the terminal component; and
    wherein the axes of the rotating shafts A, B, C are vertical to the plane of the terminal component and the axes of the rotating shafts D, E, F are mutually parallel and not vertical to the plane of the terminal component.

2. A spatial-link-type manipulator according to claim 1, wherein said rotating shaft A that connects the large boom and the outer wall is not axially parallel to the rotating shaft F that connects the oblique large boom and the oblique connecting member.

3. A spatial-link-type manipulator according to claim 1, wherein the terminal component is a horizontal link parallel to a plane of said drive device.

4. A spatial-link-type manipulator according to claim 1, wherein the small boom and the oblique small boom are asymmetric to the middle point of the terminal component.

5. A spatial-link-type manipulator according to claim 1, wherein the radian of the small boom is equal to that of the oblique small boom.

6. A spatial-link-type manipulator according to claim 1, wherein the rotating shaft A is coaxial with the drive device.

7. A spatial-link-type manipulator according to claim 1, wherein the spatial-link-type manipulator also comprises a clamp for clamping a product.

8. A spatial-link-type manipulator according to claim 1, wherein the spatial-link-type manipulator further comprises an oblique connecting member that is installed on the inner wall, and the oblique large boom is fixed on the oblique connecting member.

* * * * *